US 7,459,974 B2

(12) United States Patent
Johnson et al.

(10) Patent No.: US 7,459,974 B2
(45) Date of Patent: Dec. 2, 2008

(54) SYSTEM AND METHOD FOR DISTORTION CANCELLATION IN AMPLIFIERS

(75) Inventors: Douglas M. Johnson, Doylestown, PA (US); Rajah V. Vysyaraju, Princeton, NJ (US); Steven Seiz, South Plainfield, NJ (US)

(73) Assignee: Anadigics, Inc., Warren, NJ (US)

( * ) Notice: Subject to any disclaimer, the term of this patent is extended or adjusted under 35 U.S.C. 154(b) by 0 days.

(21) Appl. No.: 11/945,800

(22) Filed: Nov. 27, 2007

(65) Prior Publication Data

US 2008/0186096 A1    Aug. 7, 2008

Related U.S. Application Data

(63) Continuation-in-part of application No. 11/015,863, filed on Dec. 16, 2004, now Pat. No. 7,301,396.

(51) Int. Cl.
*H03F 1/00* (2006.01)
*H03F 3/68* (2006.01)

(52) U.S. Cl. ........................... 330/151; 330/295

(58) Field of Classification Search ........................ None
See application file for complete search history.

(56) References Cited

U.S. PATENT DOCUMENTS

| 5,523,717 | A  | * | 6/1996  | Kimura ...................... 330/252 |
| 5,608,352 | A  | * | 3/1997  | Itakura ....................... 330/253 |
| 6,320,461 | B1 | * | 11/2001 | Lee ............................. 330/52 |
| 6,509,796 | B2 | * | 1/2003  | Nguyen et al. ............... 330/254 |
| 6,885,245 | B2 | * | 4/2005  | Liu ............................. 330/253 |
| 6,980,050 | B2 | * | 12/2005 | Liu ............................. 330/253 |
| 6,985,035 | B1 | * | 1/2006  | Khorramabadi ............. 330/253 |

* cited by examiner

*Primary Examiner*—Robert Pascal
*Assistant Examiner*—Krista M Flanagan
(74) *Attorney, Agent, or Firm*—Morgan, Lewis & Bockius LLP

(57) ABSTRACT

A distortion cancellation amplifier is described having a main amplifier and an error amplifier. The main amplifier, in response to an input signal, generates an output signal having an amplified signal component and a distortion signal component. The error amplifier is sized and biased to generate, in response to the same input signal, a distortion signal component that has substantially the same magnitude as the distortion signal component of the main amplifier. The distortion signal component from the error amplifier is subtracted from the output signal of the main amplifier.

15 Claims, 12 Drawing Sheets

SYSTEM AND METHOD FOR DISTORTION CANCELLATION IN AMPLIFIERS This application is a continuation-in-part of application Ser. No. 11/015,863, filed Dec. 16, 2004 which issued as U.S. Pat. No. 7,301,396 on Nov. 27, 2007.

BACKGROUND OF THE INVENTION

1. Field of the Invention

The present invention relates to linear power amplifiers. More specifically, the invention relates to distortion cancellation in power amplifiers.

2. Description of the Related Art

Power amplifiers are critical components for all modern communication systems because they provide the power that enables the communication signal to propagate over the desired distances of the communication system. Communication systems are allocated defined portions of the frequency spectrum and these allocated portions, or bands, are a limited resource. Therefore, there is a strong economic incentive to use these bands as efficiently as possible by maximizing the amount of data transmitted per frequency range. Modulation techniques, such as quadrature amplitude modulation (QAM), or multi-carrier methods, such as orthogonal frequency division multiplex (OFDM), used for high data rate signals are very sensitive to signal distortion and require linear power amplifiers that do not distort the signal during the amplification process.

FIG. 1 is a schematic diagram illustrating the feed forward technique of distortion cancellation. In FIG. 1, an input signal, A, is split by splitter 105 into two portions, A1 and A2, that are directed into two paths. The lower path includes a delay line 110, a summer 130 and an error amplifier 150. The upper path includes a power amplifier 120, a coupler 140 and a delay line 160. An attenuator 145 supplies a portion of the signal from the upper path to summer 130 in the lower path; and the signals in the two paths are recombined by summer 165. In the upper path in FIG. 1, the signal exiting power amplifier 120 contains both an amplified portion of the input signal, K1A1, and distortion D generated by the nonlinearities of the power amplifier. A portion, $\alpha K1A1+\alpha D$, of the amplified signal is directed by directional coupler 140 along the upper path into delay line 160, which matches the delay caused by the error amplifier 150. The remaining portion, $\beta K1A1+\beta D$, of the amplified signal is directed by the directional coupler 140 into an attenuator 145. The attenuator 145 attenuates the amplified signal such that the its amplitude at the output of the attenuator matches that of signal A2. The input signal A2 diverted into the lower path of FIG. 1 is directed into a delay line 110. Delay line 110 is adjusted to compensate for the delay caused by the power amplifier 120, coupler 140, and attenuator 145 such that the output of the delay line arrives at the summer 130 at the same time as the attenuated signal from the attenuator. The delayed input signal is subtracted from the attenuated signal at the summer 130 such that the output signal of summer 130 is only an attenuated portion of the distortion signal. The distortion signal is amplified by the error amplifier 150 such that the amplitude and phase of the output of amplifier 150 matches the amplitude and phase of the distortion signal component of the signal exiting delay line 160. Summer 165 subtracts the amplified distortion signal from error amplifier 150 from the signal from delay line 160 leaving an output signal 111 that contains little or no distortion.

The feed forward design is susceptible to temperature variations and other factors and the delay lines must be carefully matched for wideband signals. Therefore, there remains a need for improving the linearity of power amplifiers by canceling the distortion caused by power amplifier nonlinearities.

SUMMARY OF THE INVENTION

One embodiment of the present invention is directed to a distortion cancellation amplifier, comprising: a main amplifier having a control terminal for receiving an input signal from an input port and a source terminal connected to an output port; an error amplifier having a control terminal for receiving the input signal from the input port and a source terminal; and an inverter connected between the source terminal of the error amplifier and the output port, wherein the error amplifier is sized to generate a distortion signal that substantially cancels a distortion component of an amplified output signal from the main amplifier after inversion of the distortion signal by the inverter.

Another embodiment of the present invention is directed to a method of canceling distortion in a linear power amplifier, comprising the steps of: receiving an input signal; amplifying the input signal via a main amplifier, the main amplifier generated an output signal comprising an amplified input signal and a distortion signal component; generating a distortion signal via an error amplifier, the distortion signal having substantially the same magnitude as the distortion signal component; and subtracting the distortion signal from the output signal.

Another embodiment of the present invention is directed to a distortion canceling differential amplifier comprising: a first input port for receiving a first input signal; a second input port for receiving a second input signal, the second input signal phase shifted by 180° from the first input signal; a first main transistor having a source terminal and a control terminal, the control terminal connected to the first input port and the source terminal providing a first main output signal to a first output port; a second main transistor having a source terminal and a control terminal, the control terminal connected to the second input port and the source terminal providing a second main output signal to a second output port; a first error transistor having a source terminal and a control terminal, the control terminal of the first error transistor connected to the first input port and the source terminal of the first error transistor providing a first error signal to the second output port; and a second error transistor having a source terminal and a control terminal, the control terminal of the second error transistor connected to the second input port and the source terminal of the second error transistor providing a second error signal to the first output port.

Another embodiment of the present invention is directed to a distortion cancellation amplifier, comprising: a main differential amplifier having a first input port, a second input port, a first output port, and a second output port; and an error differential amplifier having a first input port connected to the first input port of the main differential amplifier, a second input port connected to the second input port of the main differential amplifier, a first output port connected to the second output of the main differential amplifier, and a second output port connected to the first output port of the main differential amplifier, wherein the error differential amplifier is sized to generate a distortion signal having substantially the same amplitude as a distortion signal component generated by the main differential amplifier and an amplified input signal at least 20 db below an amplified input signal from the main differential amplifier.

Another embodiment of the present invention is directed to a distortion cancellation amplifier, comprising: a main differential amplifier having a first input port, a second input port, a first output port, and a second output port; and an error differential amplifier having a first input port connected to a first sink terminal of the main differential amplifier, a second input port connected to a second sink terminal of the main differential amplifier, a first error output port connected to the second output port of the main differential amplifier, and a second error output port connected to the first output port of the main differential amplifier, wherein the error differential amplifier is sized to generate a distortion signal having substantially the same amplitude as a distortion signal component generated by the main differential amplifier and an amplified input signal at least 20 dB below an amplified input signal from the main differential amplifier.

BRIEF DESCRIPTION OF THE DRAWINGS

The invention will be described by reference to the preferred and alternative embodiments thereof in conjunction with the drawings in which.

DETAILED DESCRIPTION

A distortion cancellation amplifier is described having a main amplifier and an error amplifier. The main amplifier, in response to an input signal, generates an output signal having an amplified signal component and a distortion signal component. The error amplifier is sized and biased to generate, in response to the same input signal, a distortion signal component that has substantially the same magnitude as the distortion signal component of the main amplifier. The distortion signal component from the error amplifier is subtracted from the output signal of the main amplifier.

Figure 1:
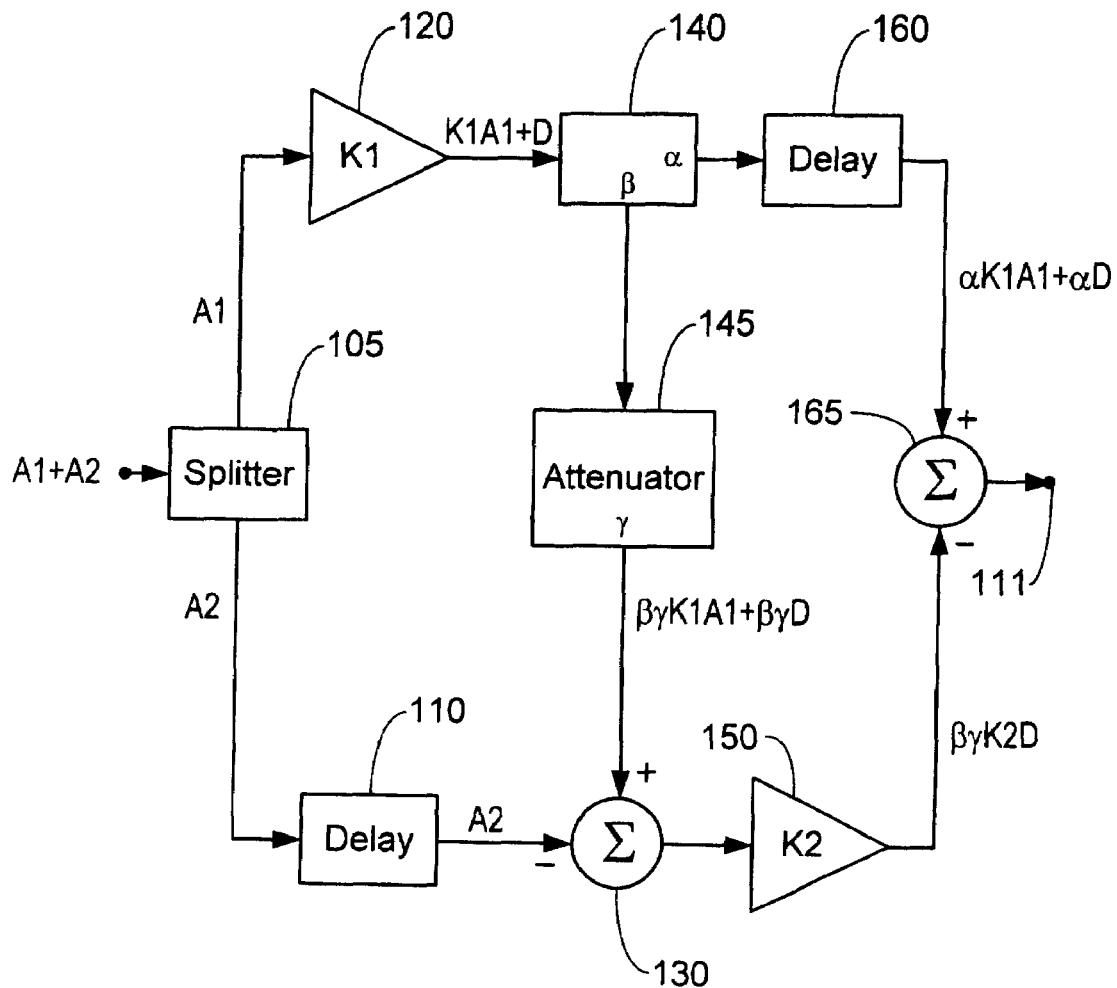
FIG. 1 is a schematic diagram illustrating the feed forward technique of distortion cancellation.
Figure 2:
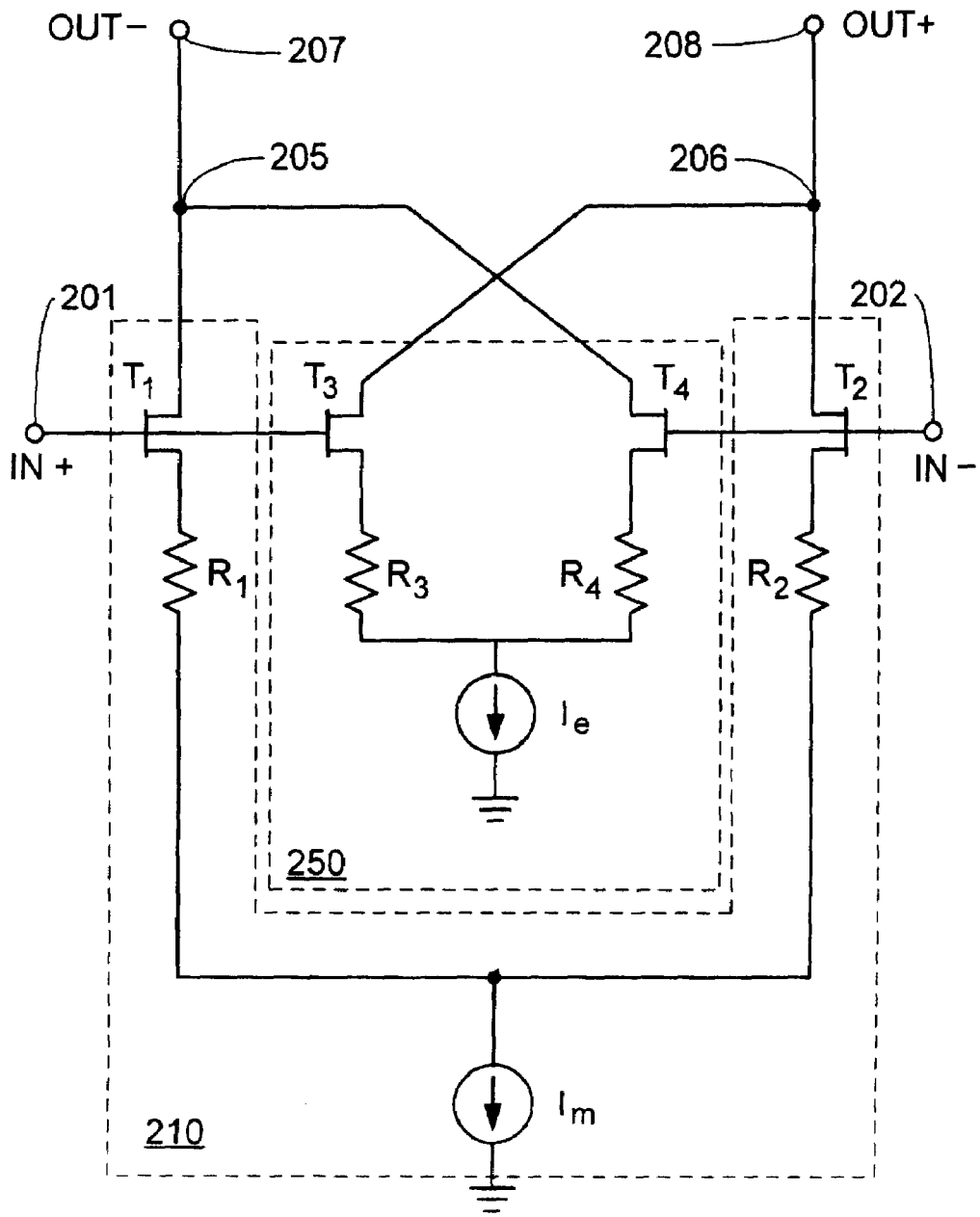
FIG. 2 is a schematic diagram illustrating one embodiment of the present invention.

FIG. 2 is a schematic diagram illustrating one embodiment 200 of the present invention. FIG. 2 shows a differential amplifier 210 with a cross-coupled differential error amplifier 250. Although FIG. 2 shows the use of a field effect transistor (FET), preferably a MESFET, it should also be recognized that a bipolar transistor (BJT) or a heterojunction bipolar transistor (HBT) may also be used and are within the scope of the present invention. As used herein, a control terminal of a transistor refers to a gate terminal of a FET or a base terminal of a BJT or HBT. Similarly, a source terminal of a transistor refers to a collector terminal of a bipolar transistor or a drain terminal of a FET and a sink terminal of a transistor refers to an emitter terminal of a bipolar transistor or a source terminal of a FET.

In FIG. 2, transistors T1 and T2 form a balanced main differential amplifier and transistors T3 and T4 form a balanced error differential amplifier 250. A first input port 201 provides a first input signal, IN+, to a control terminal of T1 and T3. Similarly, a second input port 202 provides a second input signal, IN−, that is 180° out of phase with IN+ to a control terminal of T2 and T4. A source terminal of T3 is connected to a source terminal of T2 at node 206 and a source terminal of T4 is connected to a source terminal of T1 at node 205, thereby cross-coupling the main amplifier to the error amplifier 250. A first output port 207 is connected to node 205 and provides a first output signal, OUT−, to a first external load that is not shown. A second output port 208 is connected to node 206 and provides a second output signal, OUT+, to a second external load that is not shown. Resistors R1 and R2, along with current source Im, are selected to bias transistors T1 and T2. Similarly, resistors R3 and R4, along with current source, Ie, are selected to bias transistors T3 and T4.

The cross-coupling of the main amplifier to the error amplifier 250 causes a summed signal at the output ports 207 and 208 to be the difference of an amplified main signal and an amplified error signal. The amplified main signal generated by T1 and T2 includes an amplified input signal component and a distortion component. In a preferred embodiment, the amplified error signal generated by T3 and T4 includes a relatively small input signal component and a distortion component. The distortion component of T1 preferably has about the same magnitude as the distortion component of the T4 amplified signal but is 180° out of phase. Similarly, the distortion component of T2 has about the same magnitude as the distortion component of the T3 amplified signal but is 180° out of phase. At the first output port 207, the distortion component of the T4 signal cancels the distortion component of the T1 signal, leaving a slightly attenuated amplified input signal from T1. Similarly, at the second output port 208, the distortion component of the T3 signal cancels the distortion component of the T2 signal, leaving a slightly attenuated amplified signal from T2. The slight attenuation of the amplified input signals at the output ports arise from the relatively small input signal component in the amplified error signals from T3 and T4. In a preferred embodiment, the relatively small input signal component in the amplified error signals from T3 and T4 is at least 20 db below the amplified input signals from T1 and T2.

Figure 3:
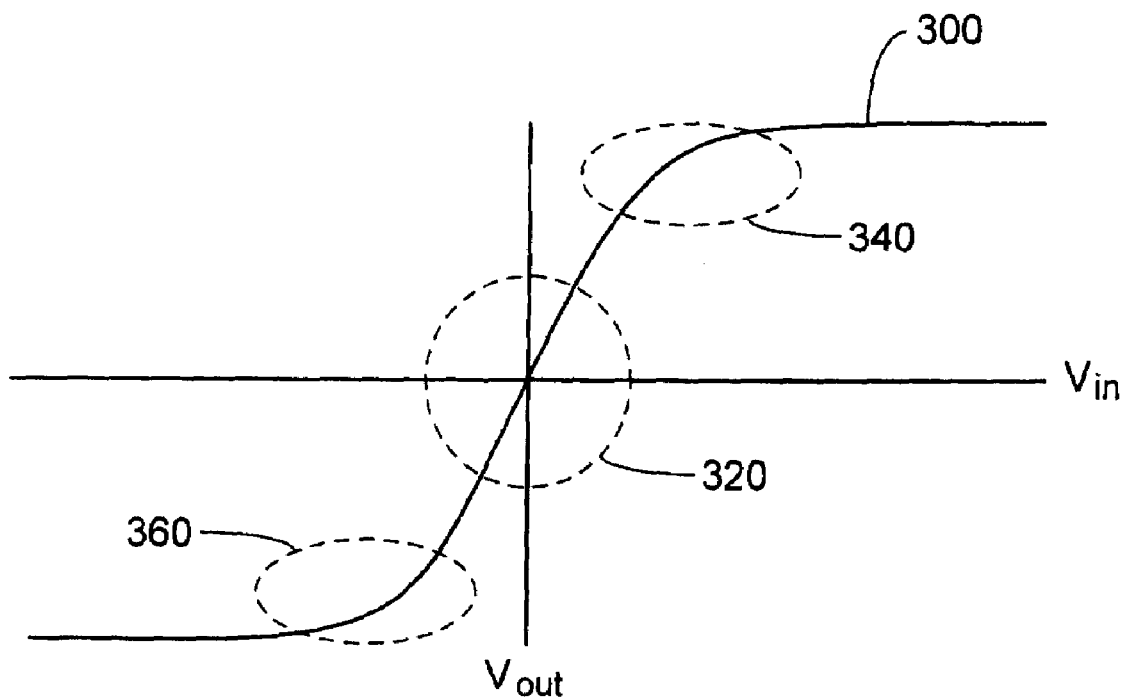
FIG. 3 is a diagram illustrating an input-output characteristic of the embodiments shown in FIG. 2.

The error amplifier transistors, T3 and T4, are designed and operated such that they generate distortion components having approximately the same magnitude as the distortion components from T1 and T2. FIG. 3 is an illustrative example of the output versus input characteristic of a differential amplifier. In FIG. 3, output voltage as a function of input voltage of a differential amplifier is shown by line 300. Line 300 has a linear region 320 where an output voltage varies linearly with an input voltage with the slope of line 300 proportional to the voltage gain of the amplifier. Regions 340 and 360 indicate nonlinear regions where the output voltage does not vary linearly with the input voltage. FIG. 3 indicates that the voltage gain in nonlinear regions 340 and 360 is less than the voltage gain in the linear region 320.

In a preferred embodiment, the main amplifier such as that shown in FIG. 2 is simulated using existing MESFET nonlinear models for T1 and T2 with a nonlinear simulation software such as, for example, Advanced Design System (ADS) available from Agilent Technologies, Inc. of Palo Alto, Calif. although other nonlinear simulation software may also be used. In the simulation, distortion products of the main amplifier are first estimated. Distortion products may be mainly the odd order intermodulation products containing the amplified signal. An error amplifier is then simulated over a range of FET sizes, degeneration resistors (R3-R4 in FIG. 2), and bias currents (Ie in FIG. 2) until an output of the error amplifier has a fundamental that is at least 10 db, preferably 20 db, below a desired signal but with a distortion signal that has substantially the same amplitude as a distortion signal component from the main amplifier such that the output of the error amplifier cancels the distortion component of the main amplifier without substantially decreasing the amplified input signal at the fundamental. A bench circuit may be fabricated based on the simulation results and further improvements may be achieved with additional adjustments of the error amplifier bias current, Ie.

Figure 4:
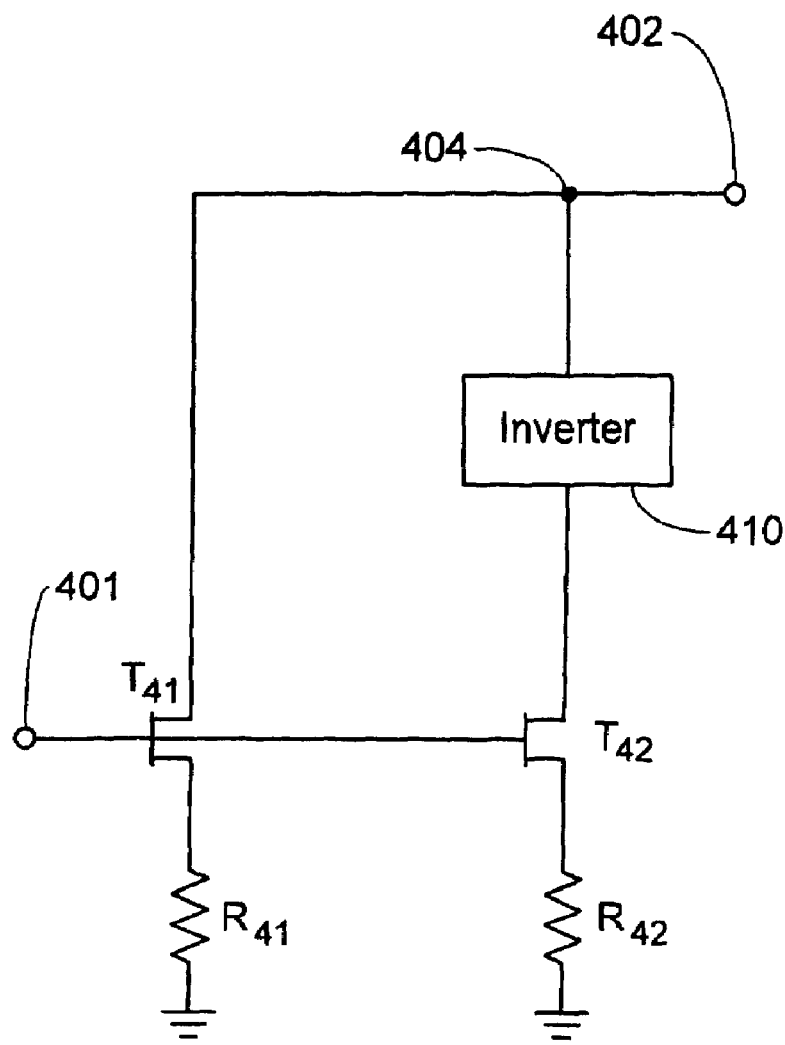
FIG. 4 is a schematic diagram illustrating another embodiment of the present invention.

FIG. 4 is a schematic diagram illustrating another embodiment 400 of the present invention. In FIG. 4, a single ended amplifier 400 is shown having an input port 401 and an output port 402. Input port 401 receives an input signal, which is presented to a control terminal of an amplifying transistor T41 and to a control terminal of an error transistor T42. A source terminal of T41 is connected to the output port 402. A source terminal of the error transistor T42 is connected to the output port 402 through an inverter 410. The inverter 410 phase shifts a distortion signal from the error transistor T42 by 180° such that the distortion signal from the error transistor T42 substantially cancels a distortion component of an amplified signal from the main transistor T41, thereby leaving a substantially distortion free amplified signal at the output port 402. Sink resistor R41 connects a sink terminal of the main transistor T41 to a ground and may be selected to set a bias point of T41. Sink resistor R42 connects a sink terminal of the error transistor T42 to a ground and may be selected to set a bias point of T42. A current source (not shown) may also be added in series to each sink resistor to further control the bias point of each transistor.

The size of the error transistor T42 and a value for sink resistors R41 and R42 may be selected based on circuit simulations using nonlinear simulation software as described previously. Further optimization of distortion cancellation may be done after fabrication by adjusting the current source for the error transistor.

Figure 5:
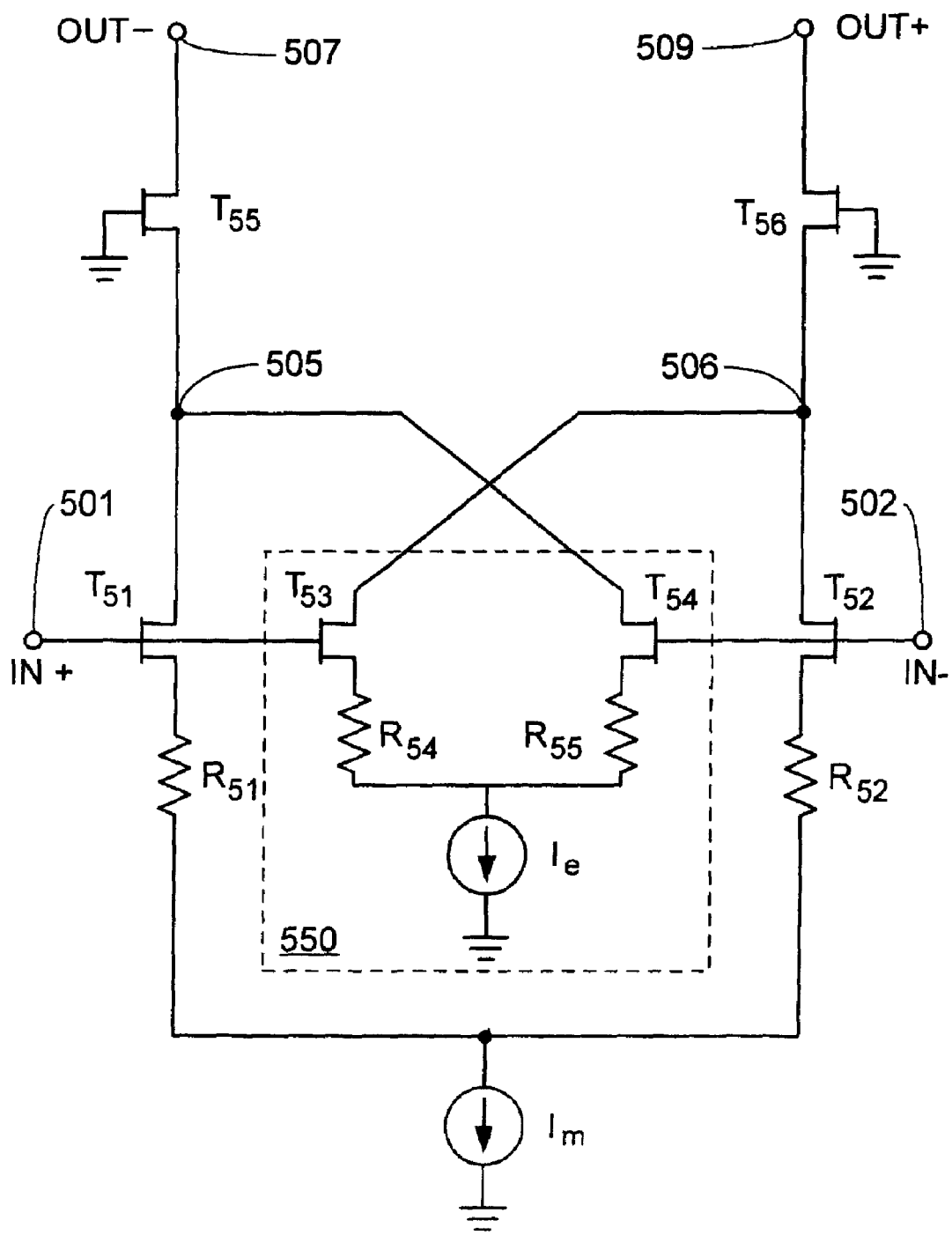
FIG. 5 is a schematic diagram illustrating another embodiment of the present invention.

FIG. 5 is a schematic diagram illustrating another embodiment 500 of the present invention. In FIG. 5, transistors T51, T52, T55, and T56 form a balanced main differential cascode amplifier and transistors T53 and T54 form a balanced differential error amplifier 550. The main cascode amplifier may provide improved linearity of the linear region 320 compared to the main amplifier of FIG. 2. A first input port 501 provides a first input signal, IN+, to a control terminal of a first main transistor, T51, and a first error transistor, T53. Similarly, a second input port 502 provides a second input signal, IN−, that is 180° out of phase with IN+ to a control terminal of a second main transistor, T52, and a second error transistor, T54. An input port of cascode transistors T55 and T56 is AC grounded. A source terminal of T53 is connected to a source terminal of T52 at node 506 and a source terminal of T54 is connected to a source terminal of T51 at node 505, thereby cross-coupling the main amplifier to the error amplifier 550. A first output port 507 is connected to node 505 through a first cascode transistor T55 and provides a first output signal, OUT−, to a first external load that is not shown. The first output signal, OUT−, is the sum of a first main output signal provided by the source terminal of T51 and a second error signal provided by the source terminal of T54. A second output port 509 is connected to node 506 through a second cascode transistor T56 and provides a second output signal, OUT+, to a second external load that is not shown. Resistors R51 and R52, along with current source, Im, are selected to bias transistors T51 and T52. Similarly, resistors R54 and R55, along with current source, Ie, are selected to bias transistors T53 and T54.

The cross-coupling of the main amplifier to the error amplifier 550 causes a summed signal at the output ports 507 and 509 to be the difference of an amplified main signal and an amplified error signal. The amplified main signal for T51 and T52 includes an amplified input signal component and a distortion component. In a preferred embodiment, the amplified error signal for T53 and T54 includes a relatively small input signal component and a distortion component. The distortion component of T51 preferably has about the same magnitude as the distortion component of the T54 amplified signal but is 180° out of phase. Similarly, the distortion component of T52 has about the same magnitude as the distortion component of the T53 amplified signal but is 180° out of phase. At the first output port 507, the distortion component of the T54 signal cancels the distortion component of the T51 signal, leaving a slightly attenuated amplified signal from T51. Similarly, at the second output port 509, the distortion component of the T53 signal cancels the distortion component of the T52 signal, leaving a slightly attenuated amplified signal from T52. The slight attenuation of the amplified input signals at the output ports arise from the relatively small input signal component in the amplified error signals from T53 and T54. In a preferred embodiment, the relatively small input signal component in the amplified error signals from T53 and T54 is at least 20 db below the amplified input signals from T51 and T52.

Error amplifier 550 is designed, sized, and operated such that it generates distortion components having approximately the same magnitude as the distortion components generated by the main amplifier. In a preferred embodiment, a main amplifier such as that shown in FIG. 5 is simulated using existing MESFET nonlinear models for T51 and T52 with a nonlinear simulation software such as, for example, ADS although other nonlinear simulation software may also be used. In the simulation, distortion products of the main amplifier are first estimated. Distortion products may be mainly the odd order intermodulation products containing the amplified signal. An error amplifier is then simulated over a range of FET sizes, degeneration resistors (R54-R55 in FIG. 5), and bias currents (Ie in FIG. 5) until an output of the error amplifier has a fundamental that is at least 10 db, preferably 20 db, below a desired signal but with a distortion signal that has substantially the same amplitude as a distortion signal component from the main amplifier such that the output of the error amplifier cancels the distortion component of the main amplifier without substantially decreasing the amplified input signal at the fundamental. A bench circuit may be fabricated based on the simulation results and further improvements may be achieved with additional adjustments of the error amplifier bias current.

Figure 6:
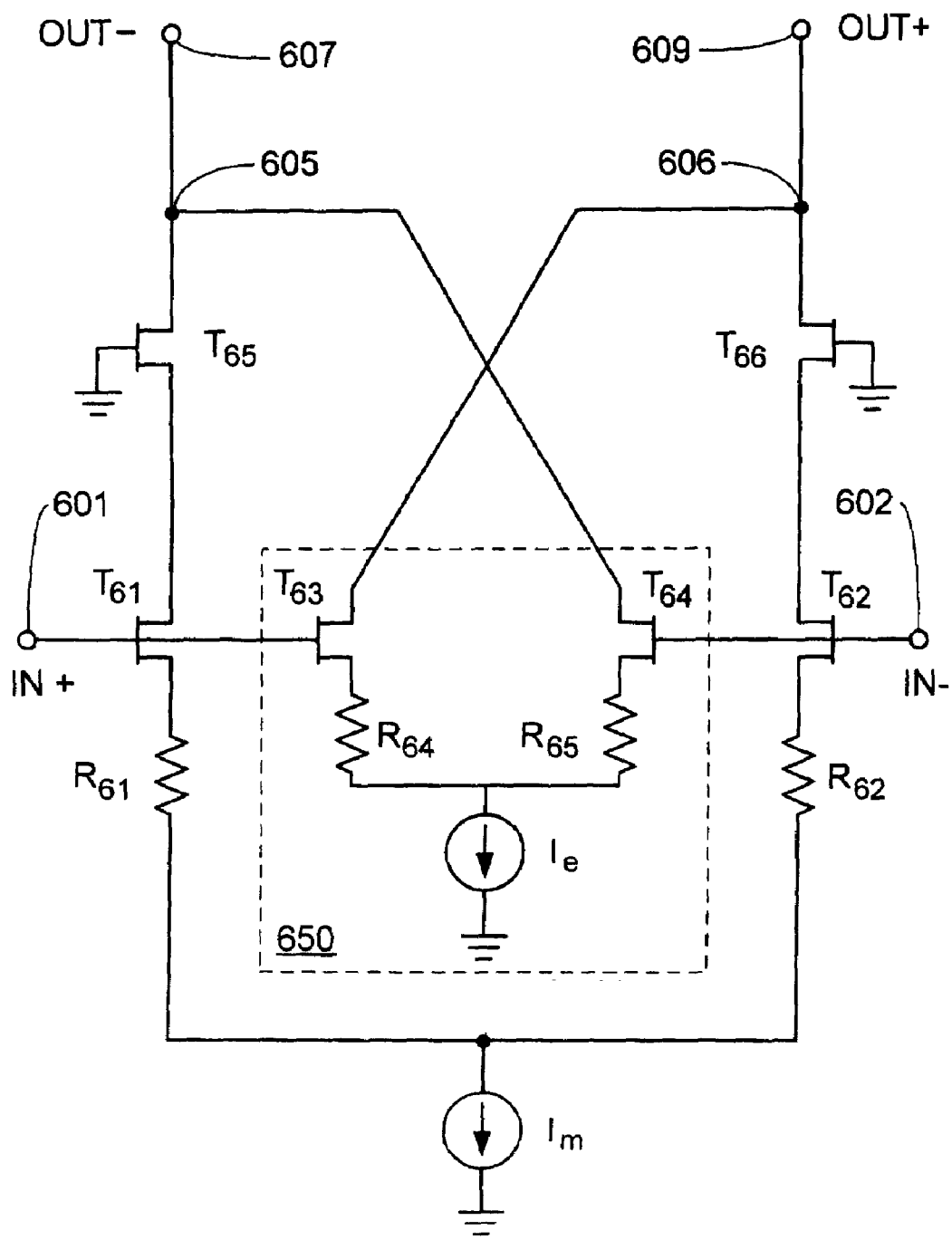
FIG. 6 is a schematic diagram illustrating another embodiment of the present invention.

FIG. 6 is a schematic diagram illustrating another embodiment 600 of the present invention. In FIG. 6, transistors T61, T62, T65, and T66 form a balanced main differential cascode amplifier and transistors T63 and T64 form a balanced differential error amplifier 650. A first input port 601 provides a first input signal, IN+, to a control terminal of a first main transistor, T61, and a first error transistor, T63. Similarly, a second input port 602 provides a second input signal, IN−, that is 180° out of phase with IN+ to a control terminal of a second main transistor, T62, and a second error transistor, T64. An input port of cascode transistors T65 and T66 is AC grounded. A first output port 607 is connected to a source terminal of T64 and to a source terminal of a first cascode transistor, T65, at node 605 and provides a first output signal, OUT−, to a first external load that is not shown. A second output port 609, connected to a source terminal of T63 and to a source terminal of a second cascode transistor, T66, at node 606, provides a second output signal, OUT+, to a second external load that is not shown, thereby cross-coupling the main amplifier to the error amplifier 650. A sink terminal of first cascode transistor T65 is connected to a source terminal of T61. A sink terminal of second cascode transistor T66 is connected to a source terminal of T62. The first output signal, OUT+, is the sum of a first main output signal provided by the source terminal of T61 and a second error signal provided by the source terminal of T64. The second output signal, OUT+, is the sum of a second main output signal provided by the source terminal of T62 and a first error signal provided by the source terminal of T63. Resistors R61 and R62, along with current source, Im, are selected to bias transistors T61 and T62. Similarly, resistors R64 and R65, along with current source, Ie, are selected to bias transistors T63 and T64.

The cross-coupling of the main amplifier to the error amplifier 650 causes a summed signal at the output ports 607 and 609 to be the difference of an amplified main signal and an amplified error signal. The amplified main signal for T61 and T62 includes an amplified input signal component and a distortion component. In a preferred embodiment, the amplified error signal for T63 and T64 includes a relatively small input signal component and a distortion component. The distortion component of T61 preferably has about the same magnitude as the distortion component of the T64 amplified signal but is 180° out of phase. Similarly, the distortion component of T62 has about the same magnitude as the distortion component of the T63 amplified signal but is 180° out of phase. At the first output port 607, the distortion component of the T64 signal cancels the distortion component of the T61 signal, leaving a slightly attenuated amplified input signal from T61. Similarly, at the second output port 609, the distortion component of the T63 signal cancels the distortion component of the T62 signal, leaving a slightly attenuated amplified input signal from T62. The slight attenuation of the amplified input signals at the output ports arise from the relatively small input signal component in the amplified error signals from T63 and T64. In a preferred embodiment, the relatively small input signal component in the amplified error signals from T63 and T64 is at least 20 db below the amplified input signals from T61 and T62.

In a preferred embodiment, a main amplifier such as that shown in FIG. 6 is simulated using existing MESFET nonlinear models for T61 and T62 with a nonlinear simulation software such as, for example, ADS although other nonlinear simulation software may also be used. In the simulation, distortion products of the main amplifier are first estimated. Distortion products may be mainly the odd order intermodulation products containing an amplified signal. An error amplifier is then simulated over a range of FET sizes, degeneration resistors (R64-R65 in FIG. 6), and bias currents (Ie in FIG. 6) until an output of the error amplifier has a fundamental that is at least 10 db, preferably 20 db, below a desired signal but with a distortion signal that has substantially the same amplitude as a distortion signal component from the main amplifier such that the output of the error amplifier cancels the distortion component of the main amplifier without substantially decreasing the amplified input signal at the fundamental. A bench circuit may be fabricated based on the simulation results and further improvements may be achieved with additional adjustments of the error amplifier bias current.

Figure 7:
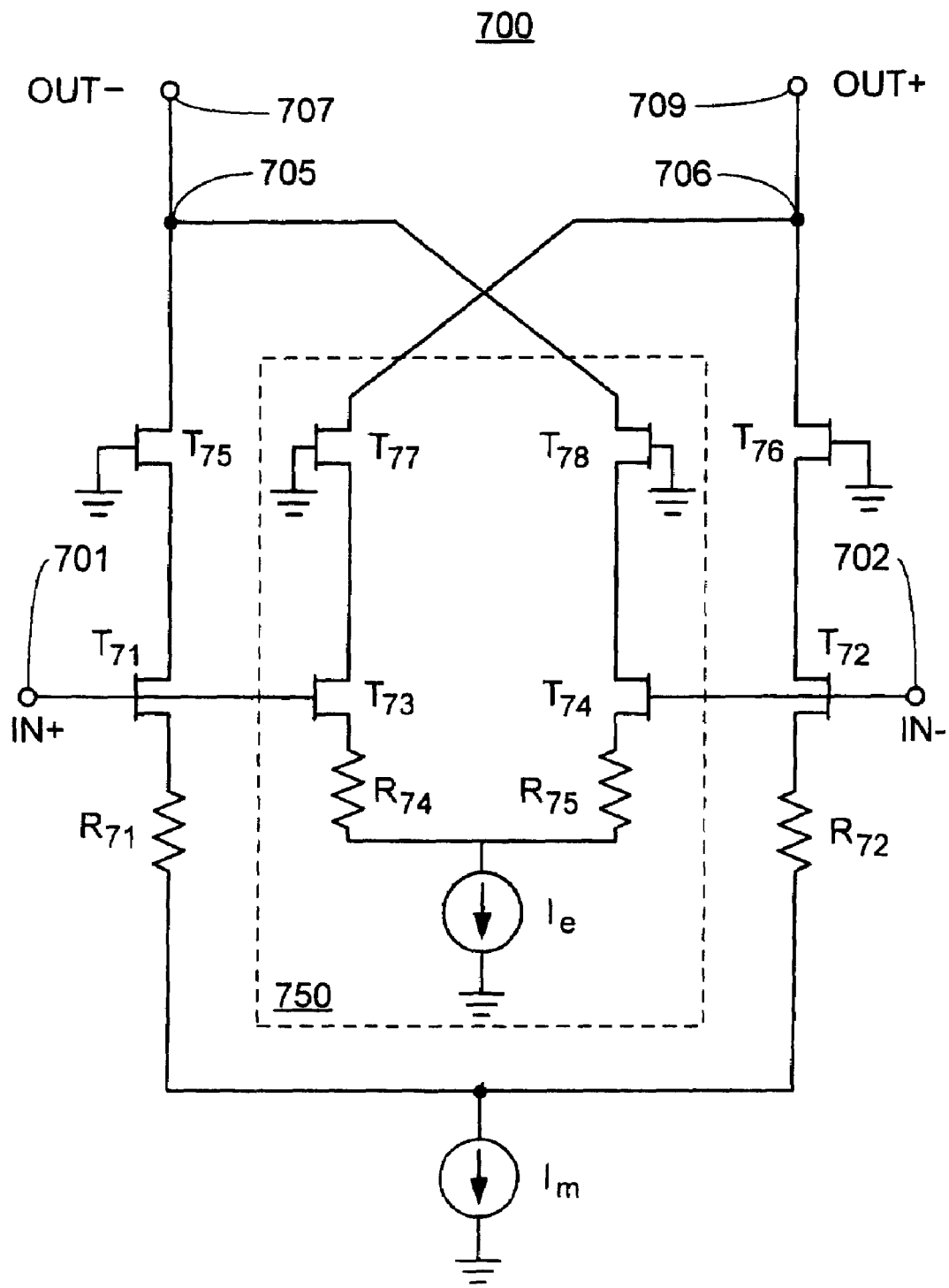
FIG. 7 is a schematic diagram illustrating another embodiment of the present invention.

FIG. 7 is a schematic diagram illustrating another embodiment 700 of the present invention. In FIG. 7, transistors T71, T72, T75, and T76 form a balanced main differential cascode amplifier. Transistors T73, T74, T77, and T78 form a balanced error differential cascode amplifier 750. A first input port 701 provides a first input signal, IN+, to a control terminal of T71 and T73. Similarly, a second input port 702 provides a second input signal, IN−, that is 180° out of phase with IN+ to a control terminal of T72 and T74. An input port of cascode transistors T75, T76, T77, and T78 is AC grounded. A source terminal of a third cascode transistor T77 is connected to a source terminal of a second cascode transistor T76 at node 706. A source terminal of a fourth cascode transistor T78 is connected to a source terminal of a first cascode transistor T75 at node 705, thereby cross-coupling the main cascode amplifier to the error cascode amplifier 750. A sink terminal of T75 is connected to a source terminal of T71 and a sink terminal of T76 is connected to a source terminal of T72. A sink terminal of T77 is connected to a source terminal of T73 and a sink terminal of T78 is connected to a source terminal of T74. A first output port 707 is connected to node 705 and provides a first output signal, OUT−, to a first external load that is not shown. A second output port 709 is connected to node 706 and provides a second output signal, OUT+, to a second external load that is not shown. Resistors R71 and R72, along with current source, Im, are selected to bias transistors T71 and T72. Similarly, resistors R74 and R75, along with current source, Ie, are selected to bias transistors T73 and T74.

The cross-coupling of the main cascode amplifier to error amplifier 750 causes a summed signal at the output ports 707 and 709 to be the difference of an amplified main signal and an amplified error signal. The amplified main signal for T71 and T72 includes an amplified input signal component and a distortion component. In a preferred embodiment, the amplified error signal for T73 and T74 includes a relatively small input signal component and a distortion component. The distortion component of T71 preferably has about the same magnitude as the distortion component of the T74 amplified signal but is 180° out of phase. Similarly, the distortion component of T72 has about the same magnitude as the distortion component of the T73 amplified signal but is 180° out of phase. At the first output port 707, the distortion component of the T74 signal cancels the distortion component of the T71 signal, leaving a slightly attenuated amplified input signal from T71. Similarly, at the second output port 709, the distortion component of the T73 signal cancels the distortion component of the T72 signal, leaving a slightly attenuated amplified input signal from T72. The slight attenuation of the amplified input signals at the output ports arise from the relatively small input signal component in the amplified error signals from T73 and T74. In a preferred embodiment, the relatively small input signal component in the amplified error signals from T73 and T74 is at least 20 db below the amplified input signals from T71 and T72.

In a preferred embodiment, a main amplifier such as that shown in FIG. 7 is simulated using existing MESFET nonlinear models for T71 and T72 with a nonlinear simulation software such as, for example, ADS although other nonlinear simulation software may also be used. In the simulation, distortion products of the main amplifier are first estimated. Distortion products may be mainly the odd order intermodulation products containing an amplified signal. An error amplifier is then simulated over a range of FET sizes, degeneration resistors (R74-R75 in FIG. 7), and bias currents (Ie in FIG. 7) until an output of the error amplifier has a fundamental that is at least 10 db, preferably 20 db, below a desired signal but with a distortion signal that has substantially the same amplitude as a distortion signal component from the main amplifier such that the output of the error amplifier cancels the distortion component of the main amplifier without substantially decreasing the amplified input signal at the fundamental. A bench circuit may be fabricated based on the simulation results and further improvements may be achieved with additional adjustments of the error amplifier bias current.

Figure 8:
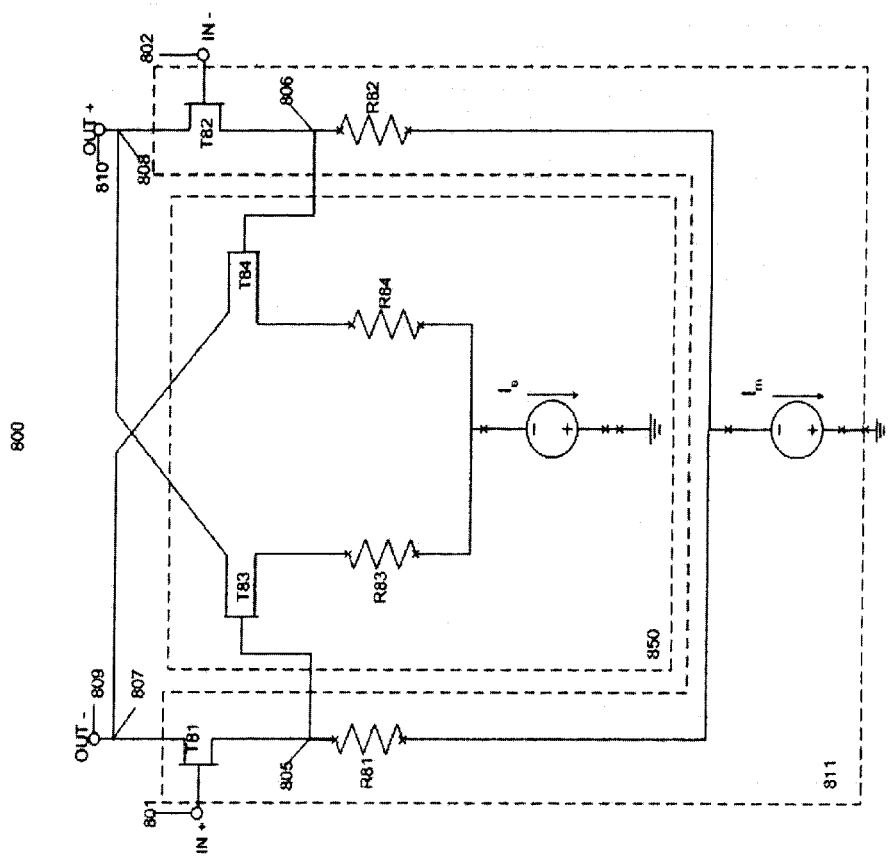
FIG. 8 is a schematic diagram illustrating another embodiment of the present invention.

FIG. 8 is a schematic diagram illustrating another embodiment 800 of the present invention. In FIG. 8, transistors T81 and T82 form a balanced main differential amplifier 811 and transistors T83 and T84 form a balanced error differential amplifier 850. A first input port 801 provides a first input signal, IN+, to a control terminal of T81, and a sink terminal of T81 provides the input error signal to the control terminal of T83 at node 805. Similarly, a second input port 802 provides a second input signal, IN−, that is 180° out of phase with IN+ to a control terminal of T82, and a sink terminal of T82 provides the input error signal to the control terminal of T84 at node 806. A source terminal of T83 is connected to a source terminal of T82 at node 808 and a source terminal of T84 is connected to a source terminal of T81 at node 807, thereby cross-coupling the main amplifier 811 to the error amplifier 850. A first output port 809 is connected to node 807 and provides a first output signal, OUT−, to a first external load that is not shown. A second output port 810 is connected to node 808 and provides a second output signal, OUT+, to a second external load that is not shown. Resistors R81 and R82, along with current source Im, are selected to bias transistors T81 and T82. Similarly, resistors R83 and R84, along with the current source, Ie, are selected to bias transistors T83 and T84.

The cross-coupling of the main amplifier 811 to the error amplifier 850 causes a summed signal at the output ports 809 and 810 to be the difference of an amplified main signal and an amplified error signal. The amplified main signal generated by T81 and T82 includes an amplified input signal component and a distortion component. In a preferred embodiment, the amplified error signal generated by T83 and T84 includes a relatively small input signal component and a distortion component. The distortion component of T81 preferably has about the same magnitude as the distortion component of the T84 amplified signal but is 180° out of phase. Similarly, the distortion component of T82 has about the same magnitude as the distortion component of the T83 amplified signal but is 180° out of phase. At the first output port 809, the distortion component of the T84 signal cancels the distortion component of the T81 signal, leaving a slightly attenuated amplified input signal from T81. Similarly, at the second output port 810, the distortion component of the T83 signal cancels the distortion component of the T82 signal, leaving a slightly attenuated amplified signal from T82. The slight attenuation of the amplified input signals at the output ports arises from the relatively small input signal component in the amplified error signals from T83 and T84. In a preferred embodiment, the relatively small input signal component in the amplified error signals from T83 and T84 is at least 20 dB below the amplified input signals from T1 and T2.

The error amplifier transistors, T83 and T84, are designed and operated such that they generate distortion components having approximately the same magnitude as the distortion components from T81 and T82.

Figure 9:
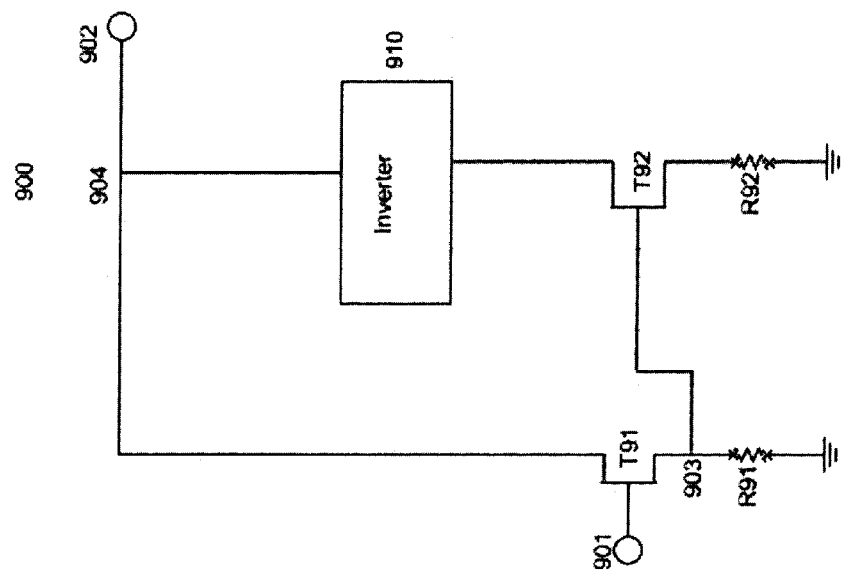
FIG. 9 is a schematic diagram illustrating another embodiment of the present invention.

FIG. 9 is a schematic diagram illustrating another embodiment 900 of the present invention. In FIG. 9, a single ended amplifier 900 is shown having an input port 901 and an output port 902. Input port 901 receives an input signal, which is presented to a control terminal of an amplifying transistor T91. The signal from a sink terminal of transistor T91 is presented through node 903 to a control terminal of an error transistor T92. A source terminal of T91 is connected through node 904 to the output port 902. A source terminal of the error transistor T92 is connected to the output port 902 through an inverter 910. The inverter 910 phase shifts a distortion signal from the error transistor T92 by 180° such that the distortion signal from the error transistor T92 substantially cancels a distortion component of an amplified signal from the main transistor T91, thereby leaving a substantially distortion free amplified signal at the output port 902. Sink resistor R91 connects a sink terminal of the main transistor T91 to a ground and may be selected to set a bias point of T91. Sink resistor R92 connects a sink terminal of the error transistor T92 to a ground and may be selected to set a bias point of T92. A current source (not shown) may also be added in series to each sink resistor to further control the bias point of each transistor.

Figure 10:
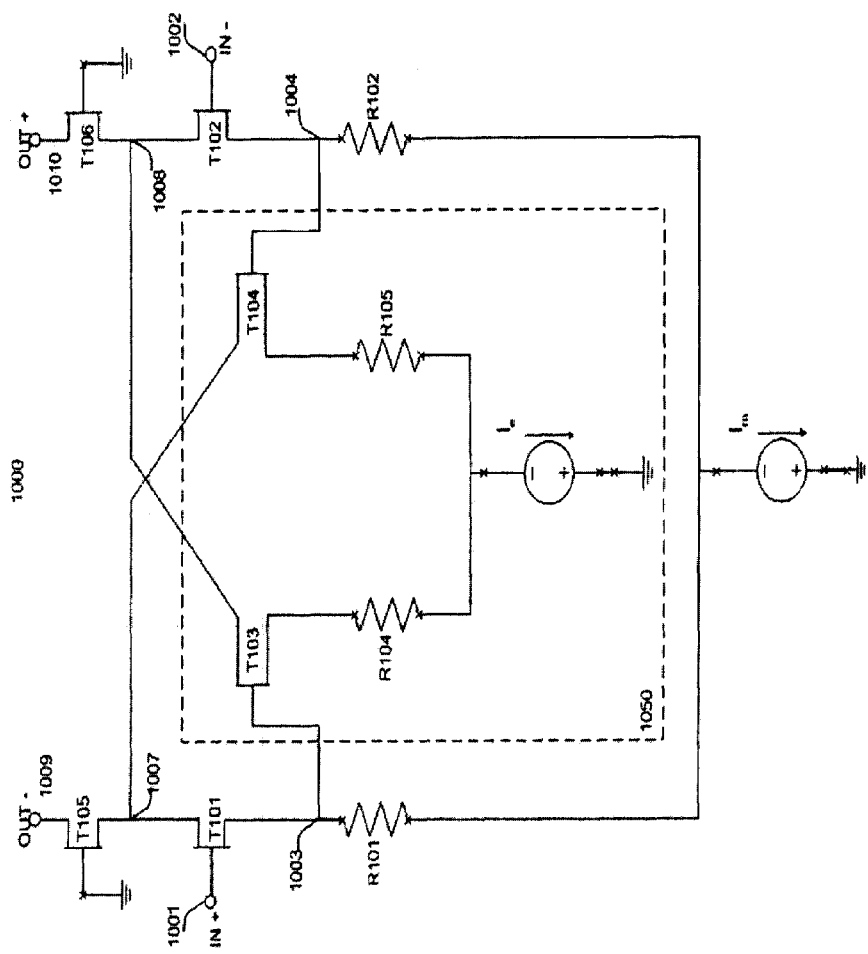
FIG. 10 is a schematic diagram illustrating another embodiment of the present invention.

FIG. 10 is a schematic diagram illustrating another embodiment 1000 of the present invention. In FIG. 10, transistors T101, T102, T105, and T106 form a balanced main differential cascode amplifier and transistors T103 and T104 form a balanced differential error amplifier 1050. The main cascode amplifier may provide improved linearity of the linear region 320 compared to the main amplifier of FIG. 8. A first input port 1001 provides a first input signal, IN+, to a control terminal of a first main transistor, T101, and a sink terminal of T101 provides the input signal through node 1003 to the control terminal of a first error transistor, T103. Similarly, a second input port 1002 provides a second input signal, IN−, that is 180° out of phase with IN+ to a control terminal of a second main transistor, T102, and a sink terminal of T102 provides the input signal throuth node 1004 to the control terminal of a second error transistor, T104. An input port of cascode transistors T105 and T106 is AC grounded. A source terminal of T103 is connected to a source terminal of T102 at node 1008 and a source terminal of T104 is connected to a source terminal of T100 at node 1007, thereby cross-coupling the main amplifier to the error amplifier 1050. A first output port 1009 is connected to node 1007 through first cascode transistor T105 and provides a first output signal, OUT−, to a first external load that is not shown. The first output signal, OUT−, is the sum of a first main output signal provided by the source terminal of T101 and a second error signal provided by the source terminal of T104. A second output port 1010 is connected to node 1008 through second cascode transistor T106 and provides a second output signal, OUT+, to a second external load that is not shown. Resistors R101 and R102, along with current source, Im, are selected to bias transistors T101 and T102. Similarly, resistors R104 and R105, along with current source, Ie, are selected to bias transistors T103 and T104.

The cross-coupling of the main amplifier to the error amplifier 1050 causes a summed signal at the output ports 1009 and 1010 to be the difference of an amplified main signal and an amplified error signal. The amplified main signal for T101 and T102 includes an amplified input signal component and a distortion component. In a preferred embodiment, the amplified error signal for T103 and T104 includes a relatively small input signal component and a distortion component. The distortion component of T101 preferably has about the same magnitude as the distortion component of the T104 amplified signal but is 180° out of phase. Similarly, the distortion component of T102 has about the same magnitude as the distortion component of the T103 amplified signal but is 180° out of phase. At the first output port 1009, the distortion component of the T104 signal cancels the distortion component of the T101 signal, leaving a slightly attenuated amplified input signal from T101. Similarly, at the second output port 1010, the distortion component of the T103 signal cancels the distortion component of the 1102 signal, leaving a slightly attenuated amplified signal from T102. The slight attenuation of the amplified input signals at the output ports arises from the relatively small input signal component in the amplified error signals from T103 and T104. In a preferred embodiment, the relatively small input signal component in the amplified error signals from T103 and T104 is at least 20 dB below the amplified input signals from T101 and T102.

Figure 11:
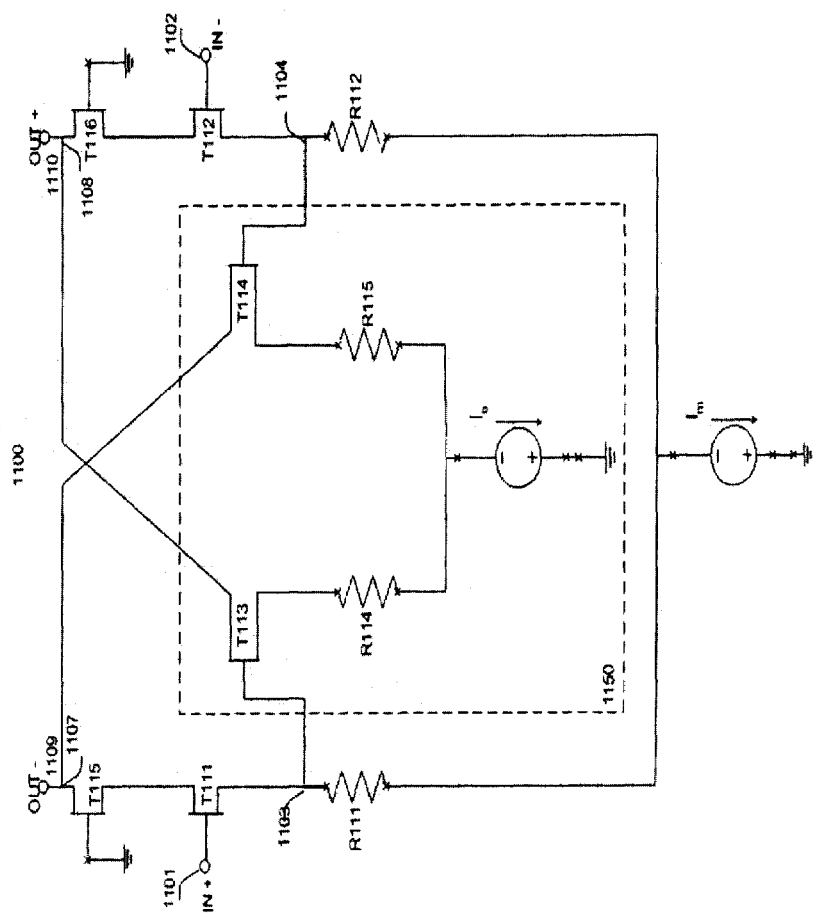
FIG. 11 is a schematic diagram illustrating another embodiment of the present invention.

FIG. 11 is a schematic diagram illustrating another embodiment 1100 of the present invention. In FIG. 11, transistors T111, T112, T115, and T116 form a balanced main differential cascode amplifier and transistors T113 and T114 form a balanced differential error amplifier 1150. A first input port 1101 provides a first input signal, IN+, to a control terminal of a first main transistor, T111, and a sink terminal of T111 provides the input signal through node 1103 to the control terminal of a first error transistor, T113. Similarly, a second input port 1102 provides a second input signal, IN−, that is 180° out of phase with IN+ to a control terminal of a second main transistor, T112, and a sink terminal of T112 provides the input signal through node 1104 to the control terminal of a second error transistor, T114. An input port of cascode transistors T115 and T116 is AC grounded. A first output port 1109 is connected to a source terminal of T114 and to a source terminal of first cascode transistor, T115, at node 1107 and provides a first output signal, OUT−, to a first external load that is not shown. A second output port 1110 connected to a source terminal of T113 and to a source terminal of second cascode transistor, T116, at node 1108, provides a second output signal, OUT+, to a second external load that is not shown, thereby cross-coupling the main amplifier to the error amplifier 1150. A sink terminal of first cascode transistor T115 is connected to a source terminal of T111. A sink terminal of second cascode transistor T116 is connected to a source terminal of T112. The first output signal, OUT−, is the sum of a first main output signal provided by the source terminal of T111 and a second error signal provided by the source terminal of T114. The second output signal, OUT+, is the sum of a second main output signal provided by the source terminal of T112 and a first error signal provided by the source terminal of T113. Resistors R111 and R112, along with current source, Im, are selected to bias transistors T111 and T112. Similarly, resistors R114 and R115, along with current source, Ie, are selected to bias transistors T113 and T114.

The cross-coupling of the main amplifier to the error amplifier 1150 causes a summed signal at the output ports 1109 and 1110 to be the difference of an amplified main signal and an amplified error signal. The amplified main signal for T111 and T112 includes an amplified input signal component and a distortion component. In a preferred embodiment, the amplified error signal for T113 and T114 includes a relatively small input signal component and a distortion component. The distortion component of T111 preferably has about the same magnitude as the distortion component of the T114 amplified signal but is 180° out of phase. Similarly, the distortion component of T112 has about the same magnitude as the distortion component of the T113 amplified signal but is 180° out of phase. At the first output port 1109, the distortion component of the T114 signal cancels the distortion component of the T111 signal, leaving a slightly attenuated amplified input signal from T111. Similarly, at the second output port 1110, the distortion component of the T113 signal cancels the distortion component of the T112 signal, leaving a slightly attenuated amplified signal from T112. The slight attenuation of the amplified input signals at the output ports arises from the relatively small input signal component in the amplified error signals from T113 and T114. In a preferred embodiment, the relatively small input signal component in the amplified error signals from T113 and T114 is at least 20 dB below the amplified input signals from T111 and T112.

Figure 12:
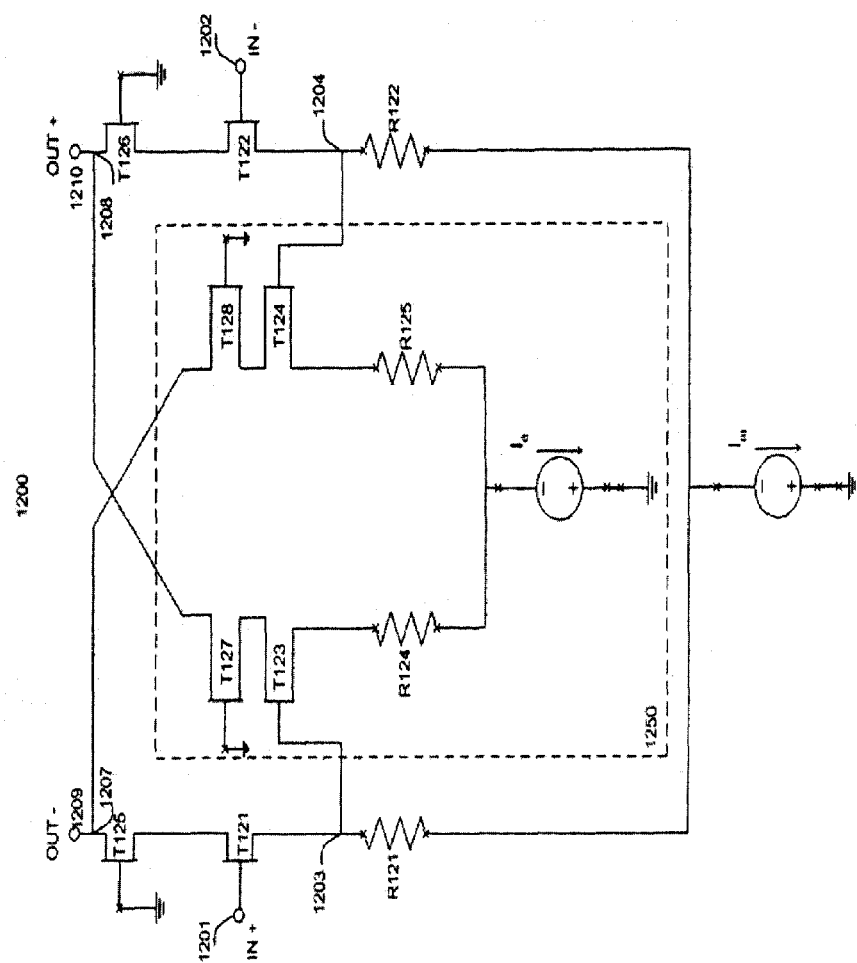
FIG. 12 is a schematic diagram illustrating another embodiment of the present invention.

FIG. 12 is a schematic diagram illustrating another embodiment 1200 of the present invention. In FIG. 12, transistors T121, T122, T125, and T126 form a balanced main differential cascode amplifier. Transistors T123, T124, T127, and T128 form a balanced error differential cascode amplifier 1250. A first input port 1201 provides a first input signal, IN+, to a control terminal of a first main transistor, T121, and a sink terminal of T121 provides the input signal through node 1203 to the control terminal of a first error transistor, T123. Similarly, a second input port 1202 provides a second input signal, IN−, that is 180° out of phase with IN+ to a control terminal of a second main transistor, T122, and a sink terminal of T122 provides the input signal through node 1204 to the control terminal of a second error transistor, T124. An input port of cascode transistors T125, T126, T127, and T128 is AC grounded. A source terminal of a third cascode transistor T127 is connected to a source terminal of a second cascode transistor T126 at node 1208. A source terminal of a fourth cascode transistor T128 is connected to a source terminal of a first cascode transistor T125 at node 1207, thereby cross-coupling the main cascode amplifier to the error cascode amplifier 1250. A sink terminal of T125 is connected to a source terminal of T121 and a sink terminal of T126 is connected to a source terminal of T122. A sink terminal of T127 is connected to a source terminal of T123 and a sink terminal of T128 is connected to a source terminal of T124. A first output port 1209 is connected to node 1207 and provides a first output signal, OUT−, to a first external load that is not shown. A second output port 1210 is connected to node 1208 and provides a second output signal, OUT+, to a second external load that is not shown. Resistors R121 and R122, along with current source, Im, are selected to bias transistors T121 and T122. Similarly, resistors R124 and R125, along with current source, Ie, are selected to bias transistors T123 and T124.

The cross-coupling of the main cascode amplifier to the error cascode amplifier 1250 causes a summed signal at the output ports 1209 and 1210 to be the difference of an amplified main signal and an amplified error signal. The amplified main signal for T121 and T122 includes an amplified input signal component and a distortion component. In a preferred embodiment, the amplified error signal for T123 and T124 includes a relatively small input signal component and a distortion component. The distortion component of T121 preferably has about the same magnitude as the distortion component of the T124 amplified signal but is 180° out of phase. Similarly, the distortion component of T122 has about the same magnitude as the distortion component of the T123 amplified signal but is 180° out of phase. At the first output port 1209, the distortion component of the T124 signal cancels the distortion component of the T121 signal, leaving a slightly attenuated amplified input signal from T121. Similarly, at the second output port 1210, the distortion component of the T123 signal cancels the distortion component of the T122 signal, leaving a slightly attenuated amplified signal from T122. The slight attenuation of the amplified input signals at the output ports arises from the relatively small input signal component in the amplified error signals from T123 and T124. In a preferred embodiment, the relatively small input signal component in the amplified error signals from T123 and T124 is at least 20 dB below the amplified input signals from T121 and T122.

Having thus described at least illustrative embodiments of the invention, various modifications and improvements will readily occur to those skilled in the art and are intended to be within the scope of the invention. Accordingly, the foregoing description is by way of example only and is not intended as limiting. The invention is limited only as defined in the following claims and the equivalents thereto.

What is claimed:

1. A distortion cancellation amplifier, comprising:
    a main amplifier having a control terminal for receiving an input signal from an input port, a source terminal connected to an output port and a sink terminal;
    an error amplifier having a control terminal, a source terminal and a sink terminal, the control terminal connected to the sink terminal of the main amplifier for receiving an input signal; and
    an inverter connected between the source terminal of the error amplifier and the output port,
    wherein the error amplifier is sized to generate a distortion signal that substantially cancels a distortion component of an amplified output signal from the main amplifier after inversion of the distortion signal by the inverter.

2. The distortion cancellation amplifier of claim 1 wherein the error amplifier further includes an adjustable current source.

3. The distortion cancellation amplifier of claim 1 wherein the main amplifier is a cascode amplifier.

4. The distortion cancellation amplifier of claim 1 wherein the main amplifier, error amplifier, and inverter of the distortion cancellation amplifier are fabricated on the same die.

5. A distortion canceling differential amplifier comprising:
    a first input port for receiving a first input signal;
    a second input port for receiving a second input signal, the second input signal phase shifted by 180° from the first input signal;
    a first main transistor having a source terminal, a sink terminal and a control terminal, the control terminal connected to the first input port and the source terminal providing a first main output signal to a first output port;
    a second main transistor having a source terminal, a sink terminal and a control terminal, the control terminal connected to the second input port and the source terminal providing a second main output signal to a second output port;
    a first error transistor having a source terminal and a control terminal, the control terminal of the first error transistor connected to the sink terminal of the first main transistor and the source terminal of the first error transistor providing a first error signal to the second output port; and
    a second error transistor having a source terminal and a control terminal, the control terminal of the second error transistor connected to the sink terminal of the second main transistor and the source terminal of the second error transistor providing a second error signal to the first output port.

6. The amplifier of claim 5 wherein the first error transistor is sized to generate a distortion signal having substantially the same amplitude as a distortion signal component generated by the second main transistor and an amplified input signal at least 20 db below an amplified input signal from the second main transistor.

7. The amplifier of claim 6 further comprising a current source connected to a sink terminal of the first error transistor, the current source selected to increase a cancellation of the distortion signal component generated by the second main transistor.

8. The amplifier of claim 5 wherein the first and second main transistors and the first and second error transistors are fabricated on a same die.

9. The amplifier of claim 5 further comprising:
    a first cascode transistor having a source terminal and a sink terminal, the source terminal of the first cascode transistor connected to the first output port and to the source terminal of the second error transistor, the sink terminal of the first cascode transistor connected to the source terminal of the first main transistor; and
    a second cascode transistor having a source terminal and a sink terminal, the source terminal of the second cascode transistor connected to the second output port and to the source terminal of the first error transistor, the sink terminal of the second cascode transistor connected to the source terminal of the second main transistor.

10. The amplifier of claim 5 further comprising:
    a first cascode transistor having a source terminal and a sink terminal, the source terminal of the first cascode transistor connected to the first output port, the sink terminal of the first cascode transistor connected to the source terminal of the first main transistor and to the source terminal of the second error transistor; and
    a second cascode transistor having a source terminal and a sink terminal, the source terminal of the second cascode transistor connected to the second output port, the sink terminal of the second cascode transistor connected to the source terminal of the second main transistor and to the source terminal of the first error transistor.

11. The amplifier of claim 5 further comprising:
    first, second, third and fourth cascode transistors each having a source terminal and a sink terminal,
    the sink terminal of the first cascode transistor connected to the source terminal of the first main transistor and the source terminal of the first cascode transistor connected to the first output port and to the source terminal of the fourth cascode transistor,
    the sink terminal of the second cascode transistor connected to the source terminal of the second main transistor and the source terminal of the second cascode transistor connected to the second output port and to the source terminal of the third cascode transistor,
    the sink terminal of the third cascode transistor connected to the source terminal of the first error transistor, and
    the sink terminal of the fourth cascode transistor connected to the source terminal of the second error transistor.

12. A distortion cancellation amplifier, comprising:
    a main differential amplifier having a first input port, a second input port, a first output port, a second output port, a first sink terminal and a second sink terminal; and
    an error differential amplifier having a first input port connected to the first sink terminal of the main differential amplifier, a second input port connected to the second sink terminal of the main differential amplifier, a first output port connected to the second output port of the main differential amplifier, and a second output port connected to the first output port of the main differential amplifier, wherein the error differential amplifier is sized to generate a distortion signal having substantially the same amplitude as a distortion signal component generated by the main differential amplifier and an amplified input signal at least 20 db below an amplified input signal from the main differential amplifier.

13. The distortion cancellation amplifier of claim 12 wherein the main differential amplifier is a differential cascode amplifier.

14. The distortion cancellation amplifier of claim 12 wherein the error differential amplifier is a differential cascode amplifier.

15. The distortion cancellation amplifier of claim 12 wherein the main differential amplifier is a differential cascode amplifier and the error differential amplifier is a differential cascode amplifier.

* * * * *